United States Patent
Chu-Kung et al.

(10) Patent No.: US 10,644,112 B2
(45) Date of Patent: May 5, 2020

(54) SYSTEMS, METHODS AND DEVICES FOR ISOLATION FOR SUBFIN LEAKAGE

(71) Applicant: INTEL CORPORATION, Santa Clara, CA (US)

(72) Inventors: Benjamin Chu-Kung, Portland, OR (US); Van Le, Beaverton, OR (US); Seung Hoon Sung, Portland, OR (US); Jack Kavalieros, Portland, OR (US); Ashish Agrawal, Hillsboro, OR (US); Harold Kennel, Portland, OR (US); Siddharth Chouksey, Portland, OR (US); Anand Murthy, Portland, OR (US); Tahir Ghani, Portland, OR (US); Glenn Glass, Portland, OR (US); Cheng-Ying Huang, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/326,890

(22) PCT Filed: Sep. 28, 2016

(86) PCT No.: PCT/US2016/054196
§ 371 (c)(1),
(2) Date: Feb. 20, 2019

(87) PCT Pub. No.: WO2018/063194
PCT Pub. Date: Apr. 5, 2018

(65) Prior Publication Data
US 2019/0189749 A1     Jun. 20, 2019

(51) Int. Cl.
*H01L 29/10* (2006.01)
*H01L 21/265* (2006.01)
(Continued)

(52) U.S. Cl.
CPC .... *H01L 29/1079* (2013.01); *H01L 21/26506* (2013.01); *H01L 29/36* (2013.01);
(Continued)

(58) Field of Classification Search
CPC . H01L 29/1079; H01L 29/66; H01L 29/7851; H01L 29/16; H01L 29/165; H01L 21/26506
See application file for complete search history.

(56) References Cited

U.S. PATENT DOCUMENTS

| | | | |
|---|---|---|---|
| 2007/0190740 A1 | 8/2007 | Furukawa et al. | |
| 2014/0001520 A1* | 1/2014 | Glass | ................ H01L 29/66439 257/288 |

(Continued)

OTHER PUBLICATIONS

PCT/US2016/054196, International Search Report and Written Opinion, dated May 31, 2017, 8 pages.

*Primary Examiner* — Seahvosh Nikmanesh
(74) *Attorney, Agent, or Firm* — Schwabe, Williamson & Wyatt, P.C.

(57) ABSTRACT

A subfin leakage problem with respect to the silicon-germanium (SiGe)/shallow trench isolation (STI) interface can be mitigated with a halo implant. A halo implant is used to form a highly resistive layer. For example, a silicon substrate layer 204 is coupled to a SiGe layer, which is coupled to a germanium (Ge) layer. A gate is disposed on the Ge layer. An implant is implanted in the Ge layer that causes the layer to become more resistive. However, an area does not receive the implant due to being protected (or covered) by the gate. The area remains less resistive than the remainder of the Ge layer. In some embodiments, the resistive area of a Ge layer can be etched and/or an undercuttage (etch undercut or EUC) can be performed to expose the unimplanted Ge area of the Ge layer.

19 Claims, 5 Drawing Sheets

(51) Int. Cl.
  *H01L 29/36* (2006.01)
  *H01L 29/66* (2006.01)
  *H01L 29/78* (2006.01)
  *H01L 29/165* (2006.01)
  *H01L 29/16* (2006.01)

(52) U.S. Cl.
  CPC .......... *H01L 29/66* (2013.01); *H01L 29/7851* (2013.01); *H01L 29/16* (2013.01); *H01L 29/165* (2013.01)

(56) References Cited

U.S. PATENT DOCUMENTS

| | | |
|---|---|---|
| 2015/0249155 A1 | 9/2015 | Xu et al. |
| 2015/0255456 A1 | 9/2015 | Jacob et al. |
| 2016/0071979 A1 | 3/2016 | Jacob et al. |
| 2016/0225674 A1 | 8/2016 | Jacob |

* cited by examiner

SYSTEMS, METHODS AND DEVICES FOR ISOLATION FOR SUBFIN LEAKAGE

RELATED APPLICATION(S)

This application is a national stage filing under 35 U.S.C. § 371 of International Patent Application No. PCT/US2016/054196, filed Sep. 28, 2016, which is hereby incorporated by reference herein in its entirety.

TECHNICAL FIELD

The present disclosure relates to integrated circuit construction and more specifically to subfin leakage mitigation.

DETAILED DESCRIPTION

Figure 1:
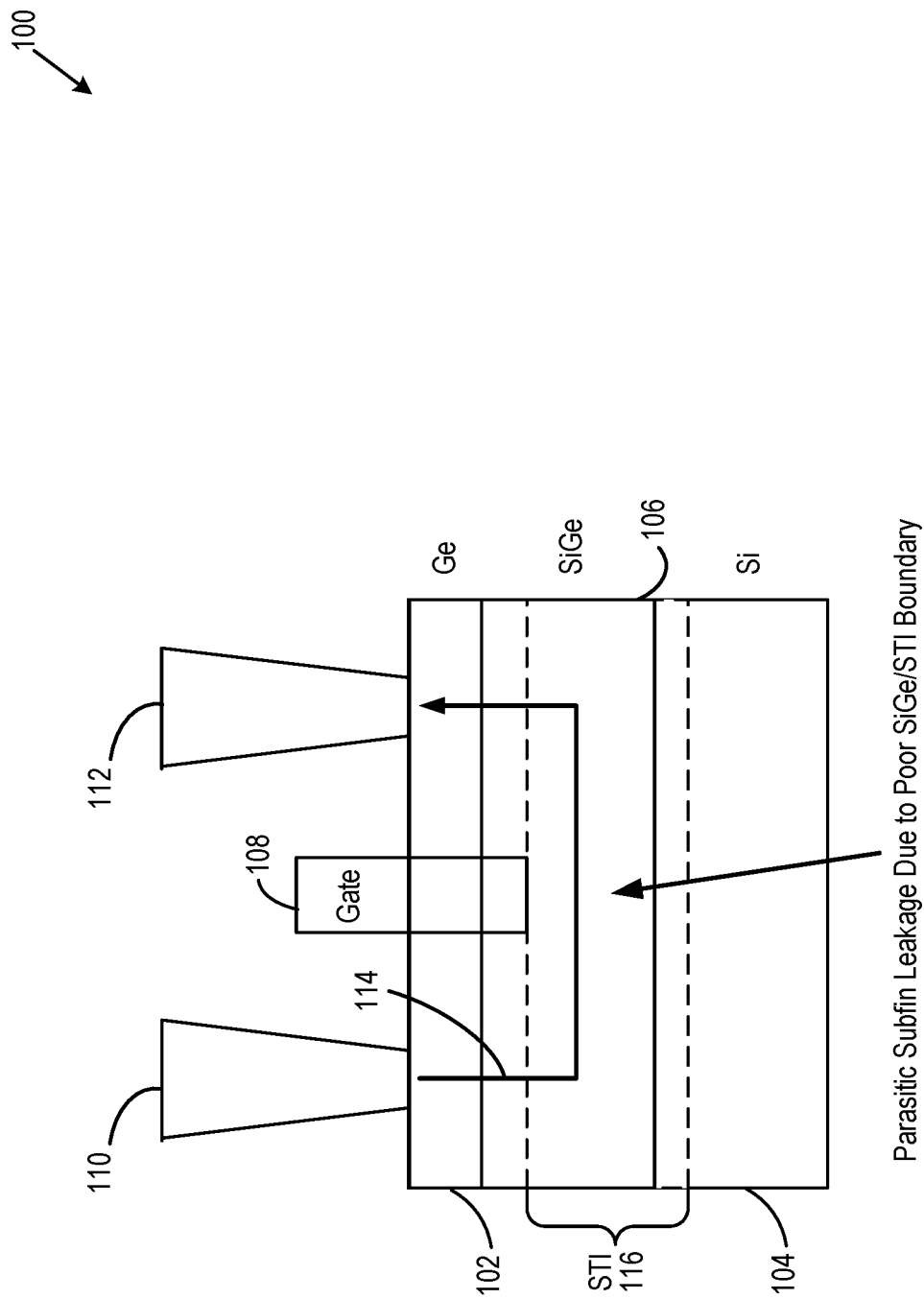
FIG. 1 is a schematic diagram illustrating parasitic subfin leakage in an integrated circuit consistent with embodiments disclosed herein.

Described herein are systems and methods of mitigating a subfin leakage using a halo-like implant. A halo implant is used to avoid or reduce impact to the channel. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention; however, the order of description should not be construed to imply that these operations are necessarily order dependent. In particular, these operations need not be performed in the order of presentation.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Implementations of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternative materials, which may or may not be combined with silicon, that include, but are not limited to, germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers: a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternative implementation, a plurality of spacer pairs may be used; for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternative semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Silicon-germanium (SiGe) films and germanium (Ge) films do not have a good interface with a shallow trench isolation (STI) oxide and can result in subfin leakage. To prevent or reduce subfin leakage, a halo-like implant is used. The halo implant is used because it reduces impact to or does not impact a channel. Other solutions can use a type of liner to form a good interface with the STI. In contrast, this leakage solution is creating a local silicon on insulator (SOI) through an implant.

FIG. 1 is a schematic diagram illustrating parasitic subfin leakage 114 in an integrated circuit. A silicon substrate layer 104 is coupled to a silicon-germanium (SiGe) layer 106, which is coupled to a germanium (Ge) layer 102. A gate 108 is disposed on the Ge layer 102. A source 110 and drain 112 are coupled to the Ge layer 102 and are intended to provide current from the source 110 to the drain 112 when the gate 108 is asserted. However, an STI interface 116 alone can cause leakage 114 without more.

Figure 2:
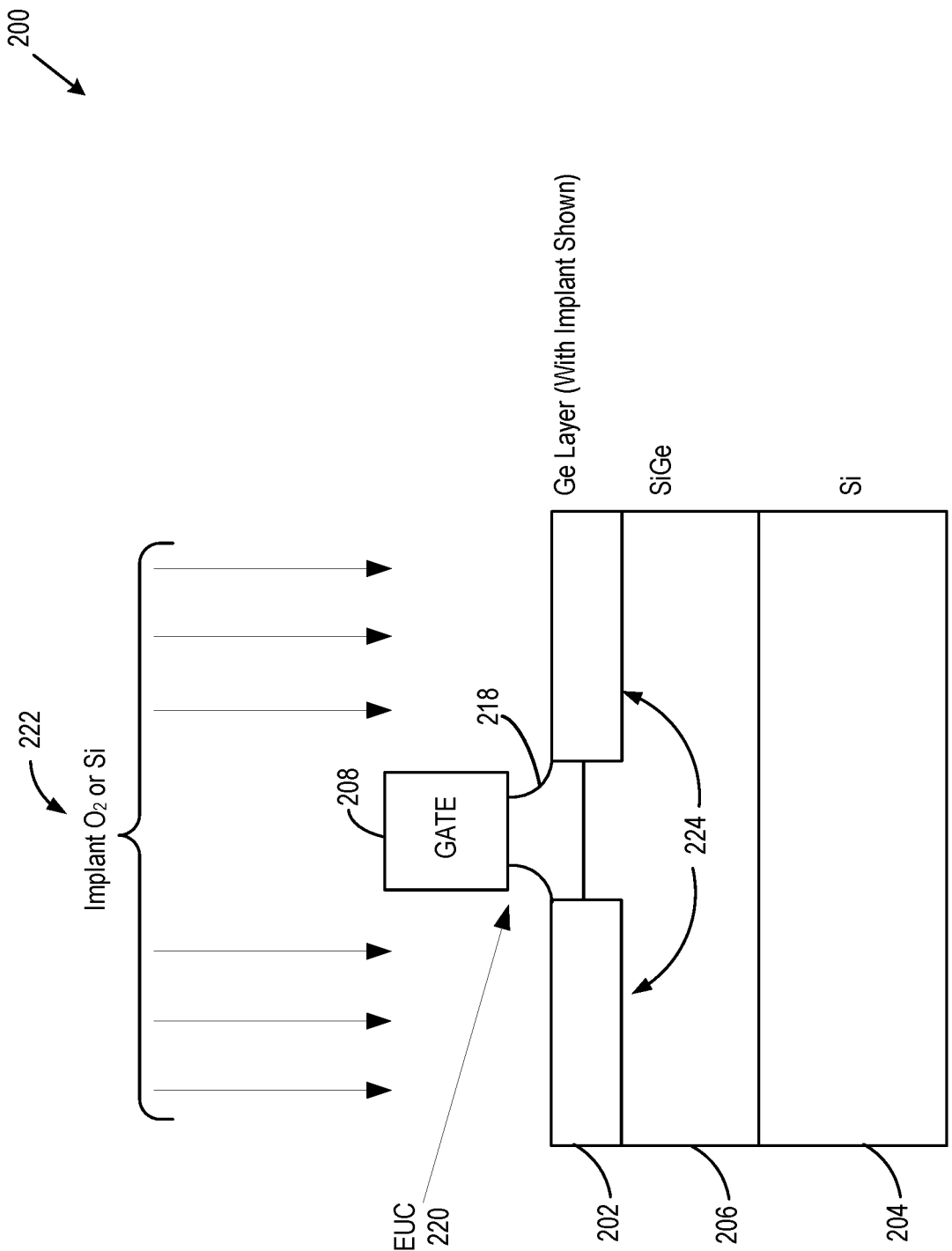
FIG. 2 is a schematic diagram illustrating a halo implant around an integrated circuit gate consistent with embodiments disclosed herein.

An STI leakage problem with respect to the SiGe/STI interface can be mitigated with a halo implant as shown in FIG. 2. A halo implant 224 is used to form a highly resistive layer. For example, a silicon substrate layer 204 is coupled to a silicon-germanium (SiGe) layer 206, which is coupled to a germanium (Ge) layer 202. A gate 208 is disposed on the Ge layer 202. The implant 222 substance is implanted in the Ge layer 202 that causes the Ge layer 202 to become more resistive. However, area 218 does not receive the implant 222 due to being protected (or covered) by the gate 208. Area 218 remains less resistive than the remainder of the Ge layer 202. In some embodiments, the resistive area of the Ge layer 202 can be etched and/or an undercuttage 220 (etch undercut or EUC) can be performed to expose the unimplanted Ge area of the Ge layer 202.

Implants can include amorphous implants (such as large atom implants including silicon, germanium, carbon or nitrogen) or oxygen implants (e.g., to cause a buried oxide). In one embodiment, an amorphous implant into a Ge layer and/or SiGe layer is performed. A top Ge layer becomes amorphized. The Ge layer is then recrystallized, otherwise growing an epitaxy layer or film (epi) on it can be difficult. An amorphized layer can also have high extrinsic resistance. To recrystallize the germanium, a temperature anneal is performed and the Ge seed is the channel. In another embodiment, a heavy oxygen implant is used to create a buried oxide. The buried oxide (or oxide layer) is formed underneath the source/drain region.

The channel, Ge, recrystallizes at a lower temperature than the SiGe subfin. This temperature difference allows a crystalline Ge source/drain on top of the amorphous or oxidized (both are highly resistive) SiGe.

Figure 3:
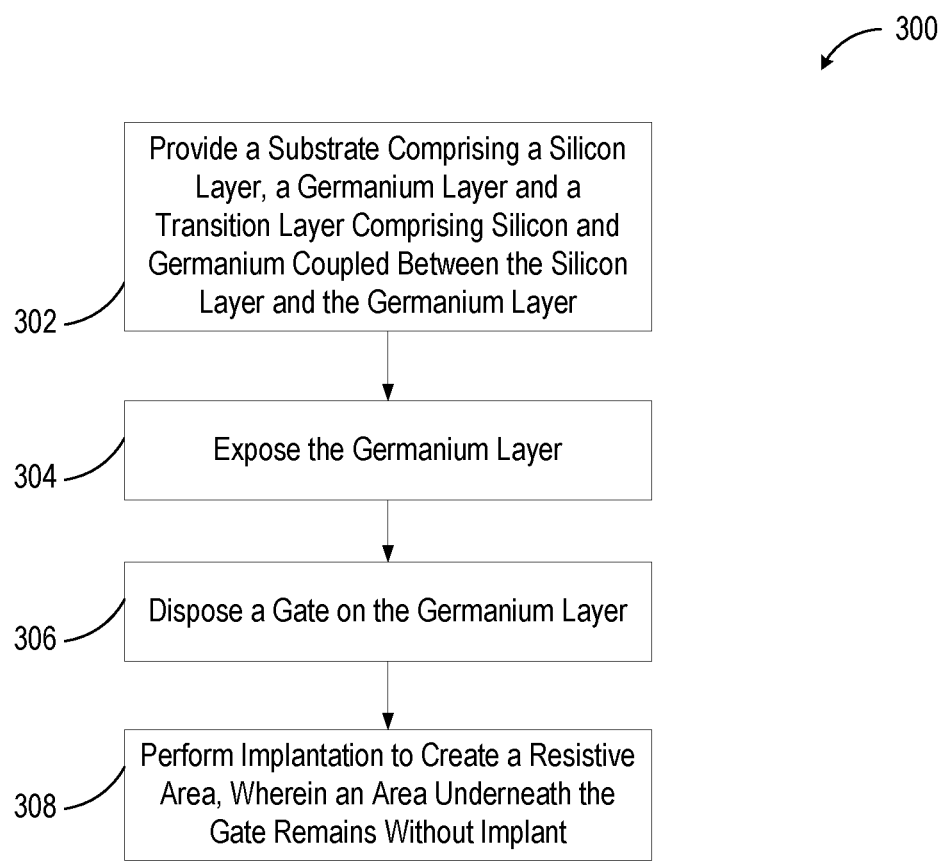
FIG. 3 is a flow chart illustrating a method for constructing an integrated circuit gate with reduced parasitic subfin leakage consistent with embodiments disclosed herein.

FIG. 3 is a flow chart illustrating a method for constructing an integrated circuit gate with reduced parasitic subfin leakage. Systems that implement such a method are described herein, including a computing system of FIG. 5 that operates an implantation and/or etching system. In block 302, the system provides a substrate comprising a silicon layer, a germanium layer and a transition layer comprising silicon and germanium coupled between the silicon layer and the germanium layer. In block 304, the system exposes the germanium layer. In block 306, the system disposes a gate on the germanium layer. In block 308, the system performs implantation to create a resistive area, wherein an area underneath the gate remains without implant.

Figure 4:
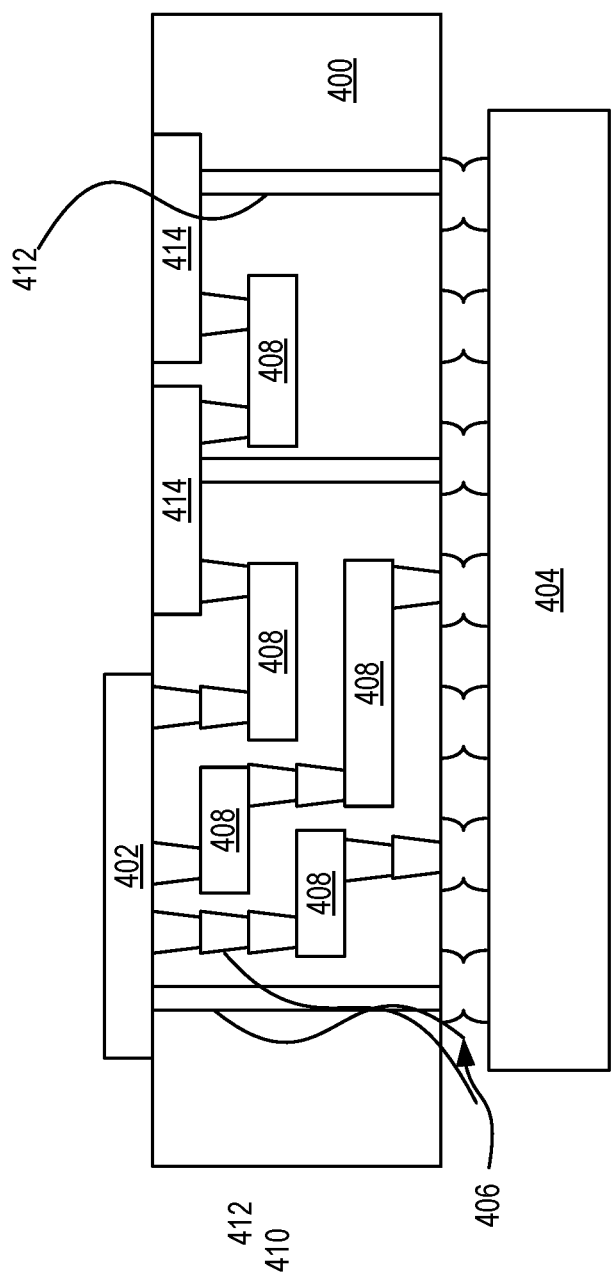
FIG. 4 is a diagram illustrating an interposer consistent with embodiments disclosed herein.

FIG. 4 illustrates an interposer 400 that includes one or more embodiments of the invention. The interposer 400 is an intervening substrate used to bridge a first substrate 402 to a second substrate 404. The first substrate 402 may be, for instance, an integrated circuit die. The second substrate 404 may be, for instance, a memory module, a computer motherboard, or another integrated circuit die. Generally, the purpose of the interposer 400 is to spread a connection to a wider pitch or to reroute a connection to a different connection. For example, an interposer 400 may couple an integrated circuit die to a ball grid array (BGA) 406 that can subsequently be coupled to the second substrate 404. In some embodiments, the first and second substrates 402/404 are attached to opposing sides of the interposer 400. In other embodiments, the first and second substrates 402/404 are attached to the same side of the interposer 400. And in further embodiments, three or more substrates are interconnected by way of the interposer 400.

[The interposer 400 may be formed of an epoxy resin, a fiberglass-reinforced epoxy resin, a ceramic material, or a polymer material such as polyimide. In further implementations, the interposer 400 may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 400.

In accordance with embodiments of the invention, apparatuses or processes disclosed herein may be used in the fabrication of interposer 400.

Figure 5:
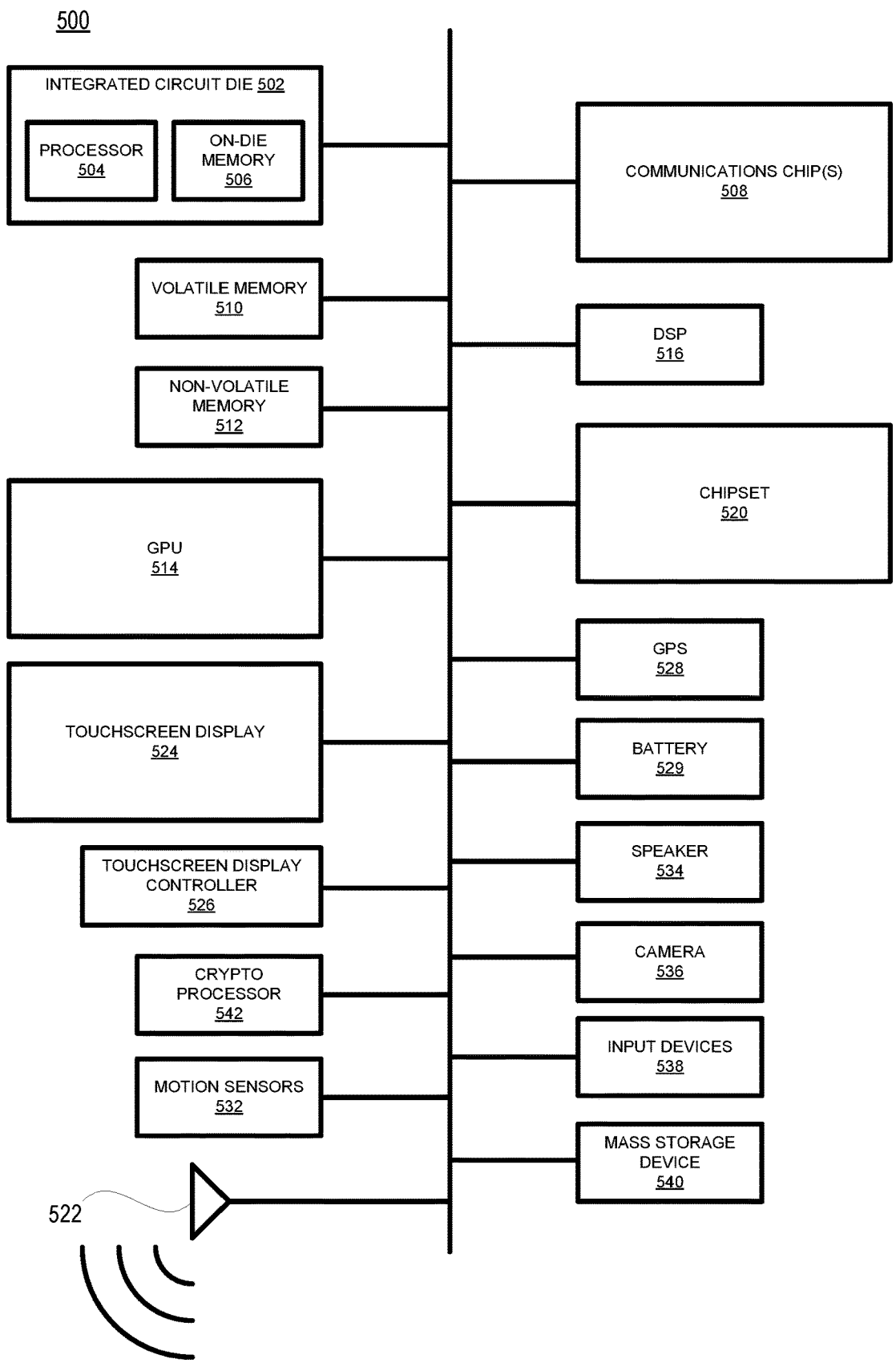
FIG. 5 is a diagram illustrating a computing device consistent with embodiments disclosed herein.

FIG. 5 illustrates a computing device 500 in accordance with one embodiment of the invention. The computing device 500 may include a number of components. In one embodiment, these components are attached to one or more motherboards. In an alternative embodiment, some or all of these components are fabricated onto a single system-on-a-chip (SoC) die, such as an SoC used for mobile devices. The components in the computing device 500 include, but are not limited to, an integrated circuit die 502 and at least one communications logic unit 508. In some implementations the communications logic unit 508 is fabricated within the integrated circuit die 502 while in other implementations the communications logic unit 508 is fabricated in a separate integrated circuit chip that may be bonded to a substrate or motherboard that is shared with or electronically coupled to the integrated circuit die 502. The integrated circuit die 502 may include a CPU 504 as well as on-die memory 506, often used as cache memory, that can be provided by technologies such as embedded DRAM (eDRAM), SRAM, or spin-transfer torque memory (STT-MRAM).

The computing device 500 may include other components that may or may not be physically and electrically coupled to the motherboard or fabricated within an SoC die. These other components include, but are not limited to, volatile memory 510 (e.g., DRAM), non-volatile memory 512 (e.g., ROM or flash memory), a graphics processing unit 514 (GPU), a digital signal processor 516, a crypto processor 542 (e.g., a specialized processor that executes cryptographic algorithms within hardware), a chipset 520, at least one antenna 522 (in some implementations two or more antenna may be used), a display or a touchscreen display 524, a touchscreen controller 526, a battery 529 or other power source, a power amplifier (not shown), a voltage regulator (not shown), a global positioning system (GPS) device 528, a compass, a motion coprocessor or sensors 532 (that may include an accelerometer, a gyroscope, and a compass), a microphone (not shown), a speaker 534, a camera 536, user input devices 538 (such as a keyboard, mouse, stylus, and touchpad), and a mass storage device 540 (such as a hard disk drive, compact disk (CD), digital versatile disk (DVD), and so forth). The computing device 500 may incorporate further transmission, telecommunication, or radio functionality not already described herein. In some implementations, the computing device 500 includes a radio that is used to communicate over a distance by modulating and radiating electromagnetic waves in air or space. In further implementations, the computing device 500 includes a transmitter and a receiver (or a transceiver) that is used to communicate over a distance by modulating and radiating electromagnetic waves in air or space.

The communications logic unit 508 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 500 may include a plurality of communications logic units 508. For instance, a first communications logic unit 508 may be dedicated to shorter range wireless communications such as Wi-Fi, NFC, and Bluetooth and a second communications logic unit 508 may be dedicated to longer range wireless communications such as GPS, EDGE, GPRS, CDMA, WiMAX, LTE, Ev-DO, and others.

The processor 504 of the computing device 500 includes one or more devices, such as gates, implanted layers, transistors or metal interconnects, that are formed in accordance with embodiments of the invention. The term "processor" may refer to any device or portion of a device that processes electronic data from registers and/or memory to transform that electronic data into other electronic data that may be stored in registers and/or memory.

The communications logic unit 508 may also include one or more devices, such as gates, implanted layers, transistors or metal interconnects, that are formed in accordance with embodiments of the invention.

In further embodiments, another component housed within the computing device 500 may contain one or more devices, such as gates, implanted layers, transistors or metal interconnects, that are formed in accordance with implementations of the invention.

In various embodiments, the computing device 500 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

EXAMPLES

The following examples pertain to further embodiments.

Example 1 is an apparatus. The apparatus includes a substrate layer including silicon, and a transition layer including silicon and germanium attached to the substrate layer. The apparatus includes a germanium layer attached to the transition layer and a transistor gate attached to the germanium layer. The apparatus also includes an implanted layer including an implant causing exposed portions of the germanium layer to become resistive, and where an area underneath the transistor gate remains without implant.

Example 2 is the apparatus of Example 1, where the implant includes oxygen.

Example 3 is the apparatus of Example 1, where the implant includes silicon, germanium, carbon or nitrogen.

Example 4 is the apparatus of Example 1, where the implant is performed as a vertical implantation.

Example 5 is the apparatus of Example 1, where the implant causes the implanted layer to become amorphized.

Example 6 is the apparatus of Example 5, where the implanted layer recrystallizes at a higher temperature than the germanium layer.

Example 7 is the apparatus of Example 5, where the germanium recrystallizes at a lower temperature than a silicon-germanium subfin.

Example 8 is the apparatus of any of Examples 1-7, where the implant reduces subfin leakage.

Example 9 is the apparatus of any of Examples 1-7, further including a crystalline germanium source and a crystalline germanium drain attached to the implanted layer.

Example 10 is the apparatus of any of Examples 11-7, where the apparatus forms part of a processor.

Example 11 is a method for constructing an integrated circuit gate with reduced parasitic subfin leakage. The method includes providing a substrate including a silicon layer, a germanium layer and a transition layer including silicon and germanium attached between the silicon layer and the germanium layer. The method includes exposing the germanium layer, and disposing a gate on the germanium layer. The method further includes performing implantation to create a resistive area, where an area underneath the gate remains without implant.

Example 12 is the method of Example 11, further including performing an undercuttage under the gate.

Example 13 is the method of Example 11, further including performing an anneal to recrystallize the germanium layer.

Example 14 is the apparatus of Example 11, where performing implantation further includes performing a halo-shaped implantation around the gate on the germanium layer.

Example 15 is the method of Example 11, where performing implantation further includes creating a local silicon on insulator area.

Example 16 is an apparatus including a method to perform a method as exemplified in any of Examples 11-15.

Example 17 is a machine-readable storage including machine-readable instructions, when executed, to implement a method or realize an apparatus as exemplified in any of Examples 11-15.

Example 18 is a machine readable medium including code, when executed, to cause a machine to perform the method of any one of Examples 11-15.

Example 19 is a computing device. The computing device includes a processor mounted on a substrate and a memory unit capable of storing data. The computing device includes a graphics processing unit and an antenna within the computing device. The computing device includes a display on the computing device and a battery within the computing device. The computing device includes a power amplifier within the processor. The computing device includes a voltage regulator within the processor, where the processor includes a substrate layer including silicon, and a transition layer including silicon and germanium attached to the substrate layer. The processor includes a germanium layer attached to the transition layer, and a transistor gate attached to the germanium layer. The processor also includes an implanted layer including an implant causing exposed portions of the germanium layer to become resistive, and where an area underneath the transistor gate remains without implant.

Example 20 is the computing device of Example 19, where the implanted layer includes amorphous silicon-germanium or oxidized silicon-germanium Example 21 is the computing device of Example 19, where a shallow trench isolation (STI) interface is achieved through the implant without a liner.

Example 22 is the computing device of Example 19, where the implanted layer is more resistive after the implant than before the implant.

Embodiments and implementations of the systems and methods described herein may include various operations, which may be embodied in machine-executable instructions to be executed by a computer system. A computer system may include one or more general-purpose or special-purpose computers (or other electronic devices). The computer system may include hardware components that include specific logic for performing the operations or may include a combination of hardware, software, and/or firmware.

Computer systems and the computers in a computer system may be connected via a network. Suitable networks for configuration and/or use as described herein include one or more local area networks, wide area networks, metropolitan area networks, and/or Internet or IP networks, such as the World Wide Web, a private Internet, a secure Internet, a value-added network, a virtual private network, an extranet, an intranet, or even stand-alone machines which communicate with other machines by physical transport of media. In particular, a suitable network may be formed from parts or entireties of two or more other networks, including networks using disparate hardware and network communication technologies.

One suitable network includes a server and one or more clients; other suitable networks may contain other combinations of servers, clients, and/or peer-to-peer nodes, and a given computer system may function both as a client and as a server. Each network includes at least two computers or computer systems, such as the server and/or clients. A computer system may include a workstation, laptop computer, disconnectable mobile computer, server, mainframe, cluster, so-called "network computer" or "thin client," tablet, smart phone, personal digital assistant or other hand-held computing device, "smart" consumer electronics device or appliance, medical device, or a combination thereof.

Suitable networks may include communications or networking software, such as the software available from Novell®, Microsoft®, and other vendors, and may operate using TCP/IP, SPX, IPX, and other protocols over twisted pair, coaxial, or optical fiber cables, telephone lines, radio waves, satellites, microwave relays, modulated AC power lines, physical media transfer, and/or other data transmission "wires" known to those of skill in the art. The network may encompass smaller networks and/or be connectable to other networks through a gateway or similar mechanism.

Various techniques, or certain aspects or portions thereof, may take the form of program code (i.e., instructions) embodied in tangible media, such as floppy diskettes, CD-ROMs, hard drives, magnetic or optical cards, solid-state memory devices, a nontransitory computer-readable storage medium, or any other machine-readable storage medium wherein, when the program code is loaded into and executed by a machine, such as a computer, the machine becomes an apparatus for practicing the various techniques. In the case of program code execution on programmable computers, the computing device may include a processor, a storage medium readable by the processor (including volatile and nonvolatile memory and/or storage elements), at least one input device, and at least one output device. The volatile and nonvolatile memory and/or storage elements may be a RAM, an EPROM, a flash drive, an optical drive, a magnetic hard drive, or other medium for storing electronic data. One or more programs that may implement or utilize the various techniques described herein may use an application programming interface (API), reusable controls, and the like. Such programs may be implemented in a high-level procedural or an object-oriented programming language to communicate with a computer system. However, the program(s) may be implemented in assembly or machine language, if desired. In any case, the language may be a compiled or interpreted language, and combined with hardware implementations.

Each computer system includes one or more processors and/or memory; computer systems may also include various input devices and/or output devices. The processor may include a general purpose device, such as an Intel®, AMD®, or other "off-the-shelf" microprocessor. The processor may include a special purpose processing device, such as ASIC, SoC, SiP, FPGA, PAL, PLA, FPLA, PLD, or other customized or programmable device. The memory may include static RAM, dynamic RAM, flash memory, one or more flip-flops, ROM, CD-ROM, DVD, disk, tape, or magnetic, optical, or other computer storage medium. The input device(s) may include a keyboard, mouse, touch screen, light pen, tablet, microphone, sensor, or other hardware with accompanying firmware and/or software. The output device(s) may include a monitor or other display, printer, speech or text synthesizer, switch, signal line, or other hardware with accompanying firmware and/or software.

It should be understood that many of the functional units described in this specification may be implemented as one or more components, which is a term used to more particularly emphasize their implementation independence. For example, a component may be implemented as a hardware circuit comprising custom very large scale integration (VLSI) circuits or gate arrays, or off-the-shelf semiconductors such as logic chips, transistors, or other discrete components. A component may also be implemented in programmable hardware devices such as field programmable gate arrays, programmable array logic, programmable logic devices, or the like.

Components may also be implemented in software for execution by various types of processors. An identified component of executable code may, for instance, comprise one or more physical or logical blocks of computer instructions, which may, for instance, be organized as an object, a procedure, or a function. Nevertheless, the executables of an identified component need not be physically located together, but may comprise disparate instructions stored in different locations that, when joined logically together, comprise the component and achieve the stated purpose for the component.

Indeed, a component of executable code may be a single instruction, or many instructions, and may even be distributed over several different code segments, among different programs, and across several memory devices. Similarly, operational data may be identified and illustrated herein within components, and may be embodied in any suitable form and organized within any suitable type of data structure. The operational data may be collected as a single data set, or may be distributed over different locations including over different storage devices, and may exist, at least partially, merely as electronic signals on a system or network. The components may be passive or active, including agents operable to perform desired functions.

Several aspects of the embodiments described will be illustrated as software modules or components. As used herein, a software module or component may include any type of computer instruction or computer-executable code located within a memory device. A software module may, for instance, include one or more physical or logical blocks of computer instructions, which may be organized as a routine, program, object, component, data structure, etc., that perform one or more tasks or implement particular data types. It is appreciated that a software module may be implemented in hardware and/or firmware instead of or in addition to software. One or more of the functional modules described herein may be separated into sub-modules and/or combined into a single or smaller number of modules.

In certain embodiments, a particular software module may include disparate instructions stored in different locations of a memory device, different memory devices, or different computers, which together implement the described functionality of the module. Indeed, a module may include a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules may be located in local and/or remote memory storage devices. In addition, data being tied or rendered together in a database record may be resident in the same memory device, or across several memory devices, and may be linked together in fields of a record in a database across a network.

Reference throughout this specification to "an example" means that a particular feature, structure, or characteristic described in connection with the example is included in at least one embodiment of the present invention. Thus, appearances of the phrase "in an example" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on its presentation in a common group without indications to the contrary. In addition, various embodiments and examples of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of materials, frequencies, sizes, lengths, widths, shapes, etc., to provide a thorough understanding of embodiments of the invention. One skilled in the relevant art will recognize, however, that the invention may be practiced without one or more of the specific details, or with other methods, components, materials, etc. In other instances, well-known structures, materials, or operations are not shown or described in detail to avoid obscuring aspects of the invention.

It should be recognized that the systems described herein include descriptions of specific embodiments. These embodiments can be combined into single systems, partially combined into other systems, split into multiple systems or divided or combined in other ways. In addition, it is contemplated that parameters/attributes/aspects/etc. of one embodiment can be used in another embodiment. The parameters/attributes/aspects/etc. are merely described in one or more embodiments for clarity, and it is recognized that the parameters/attributes/aspects/etc. can be combined with or substituted for parameters/attributes/etc. of another embodiment unless specifically disclaimed herein.

Although the foregoing has been described in some detail for purposes of clarity, it will be apparent that certain changes and modifications may be made without departing from the principles thereof. It should be noted that there are many alternative ways of implementing both the processes and apparatuses described herein. Accordingly, the present embodiments are to be considered illustrative and not restrictive, and the invention is not to be limited to the details given herein, but may be modified within the scope and equivalents of the appended claims.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

Those having skill in the art will appreciate that many changes may be made to the details of the above-described embodiments without departing from the underlying principles of the invention. The scope of the present invention should, therefore, be determined only by the following claims.

The invention claimed is:

1. An apparatus comprising:
a substrate layer comprising silicon;
a transition layer comprising silicon and germanium coupled to the substrate layer;
a germanium layer coupled to the transition layer;
a transistor gate coupled to the germanium layer; and
an implanted layer comprising an implant causing exposed portions of the germanium layer to become resistive, and
wherein an area underneath the transistor gate remains without implant.

2. The apparatus of claim 1, wherein the implant comprises oxygen.

3. The apparatus of claim 1, wherein the implant comprises silicon, germanium, carbon or nitrogen.

4. The apparatus of claim 1, wherein the implant is performed as a vertical implantation.

5. The apparatus of claim 1, wherein the implant causes the implanted layer to become amorphized.

6. The apparatus of claim 5, wherein the implanted layer recrystallizes at a higher temperature than the germanium layer.

7. The apparatus of claim 5, wherein the germanium recrystallizes at a lower temperature than a silicon-germanium subfin.

8. The apparatus of any of claim 1, wherein the implant reduces subfin leakage.

9. The apparatus of any of claim 1, further comprising a crystalline germanium source and a crystalline germanium drain coupled to the implanted layer.

10. The apparatus of any of claim 1, wherein the apparatus forms part of a processor.

11. A method for constructing an integrated circuit gate with reduced parasitic subfin leakage, the method comprising:
providing a substrate comprising a silicon layer, a germanium layer and a transition layer comprising silicon and germanium coupled between the silicon layer and the germanium layer;
exposing the germanium layer;
disposing a gate on the germanium layer; and
performing implantation to create a resistive area, wherein an area underneath the gate remains without implant.

12. The method of claim 11, further comprising performing an undercuttage under the gate.

13. The method of claim 11, further comprising performing an anneal to recrystallize the germanium layer.

14. The apparatus of claim 11, wherein performing implantation further comprises performing a halo-shaped implantation around the gate on the germanium layer.

15. The method of claim 11, wherein performing implantation further comprises creating a local silicon on insulator area.

16. A computing device comprising:
a processor mounted on a substrate;
a memory unit capable of storing data;
a graphics processing unit;
an antenna within the computing device;
a display on the computing device;
a battery within the computing device;
a power amplifier within the processor; and
a voltage regulator within the processor;
wherein the processor comprises:
a substrate layer comprising silicon;
a transition layer comprising silicon and germanium coupled to the substrate layer;
a germanium layer coupled to the transition layer;
a transistor gate coupled to the germanium layer; and
an implanted layer comprising an implant causing exposed portions of the germanium layer to become resistive, and
wherein an area underneath the transistor gate remains without implant.

17. The computing device of claim 16, wherein the implanted layer comprises amorphous silicon-germanium or oxidized silicon-germanium.

18. The computing device of claim 16, wherein a shallow trench isolation (STI) interface is achieved through the implant without a liner.

19. The computing device of claim 16, wherein the implanted layer is more resistive after the implant than before the implant.

* * * * *